United States Patent
Miller (10) Patent No.: US 10,938,335 B2
(45) Date of Patent: Mar. 2, 2021

(54) MOTOR WINDING TEMPERATURE ESTIMATOR

(71) Applicant: Panasonic Automotive Systems Company of America, Division of Panasonic Corporation of North America, Peachtree City, GA (US)

(72) Inventor: Gordon Ray Miller, Newnan, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 0 days.

(21) Appl. No.: 16/502,661

(22) Filed: Jul. 3, 2019

(65) Prior Publication Data

US 2020/0014326 A1 Jan. 9, 2020

Related U.S. Application Data

(60) Provisional application No. 62/694,301, filed on Jul. 5, 2018.

(51) Int. Cl.
| | |
|---|---|
| *H02P 29/64* | (2016.01) |
| *G01K 7/18* | (2006.01) |
| *H02K 3/04* | (2006.01) |
| *H02K 11/25* | (2016.01) |
| *G01K 13/00* | (2021.01) |

(Continued)

(52) U.S. Cl.
CPC ............... *H02P 29/64* (2016.02); *G01K 7/18* (2013.01); *G01K 13/00* (2013.01); *H02K 3/04* (2013.01); *H02K 11/25* (2016.01); *G01K 2205/00* (2013.01); *G01K 2217/00* (2013.01); *H02K 7/003* (2013.01); *H03M 1/12* (2013.01)

(58) Field of Classification Search
CPC .......... H02P 29/64; H02K 11/25; H02K 3/04; H02K 7/003; G01K 7/18; G01K 13/00; G01K 2205/00; G01K 2217/00; H03M 1/12

See application file for complete search history.

(56) References Cited

U.S. PATENT DOCUMENTS

| | | | | |
|---|---|---|---|---|
| 6,459,229 | B1 * | 10/2002 | Kawanabe | ............... H02P 8/04 318/696 |
| 2006/0087789 | A1 * | 4/2006 | Norell | .................... H02H 7/093 361/103 |

(Continued)

*Primary Examiner* — Cortez M Cook
(74) *Attorney, Agent, or Firm* — Laurence S. Roach, Esq.

(57) ABSTRACT

Examples of the present disclosure relate to a device, method, and medium storing instructions for execution by a processor for estimating motor winding temperature. In an example, a device for estimating motor winding temperature includes a motor shaft and a motor winding. The device may include a current sense resistor to detect the current passing through a common wiring. The device may include a digital to analog converter to convert an input voltage to an analog signal for comparison to the voltage and to generate a differential voltage using the signals received from the current sense resistor and an initial voltage supplied to the motor winding. The device may include a processor to use the differential voltage and a current input value to calculate a resistance of the motor winding from comparison to a temperature conversion curve.

25 Claims, 4 Drawing Sheets

(51) Int. Cl.
  *H02K 7/00* (2006.01)
  *H03M 1/12* (2006.01)

(56) References Cited

U.S. PATENT DOCUMENTS

2006/0090731 A1* 5/2006 Hoshino ............... F02D 11/105
                                                              123/399
2010/0002744 A1* 1/2010 Sheahan ................ G01R 31/42
                                                              374/1

* cited by examiner

MOTOR WINDING TEMPERATURE ESTIMATOR

CROSS-REFERENCE TO RELATED APPLICATION

This application claims benefit of U.S. Provisional Application No. 62/694,301 filed on Jul. 5, 2018, which the disclosure of which is hereby incorporated by reference in its entirety for all purposes.

FIELD OF THE INVENTION

The present disclosure generally relates to a method, system, and device for estimating the temperature of a motor winding. More specifically, the present disclosure relates to estimating motor winding temperature without the use of a thermometer, instead relying on a measurement of current, a calculation of resistance, and a correlation of that resistance for a winding to a temperature curve in order to determine if function for a motor should be slowed or stopped to preserve the life span of the motor windings.

BACKGROUND

This section is intended to introduce the reader to various aspects of art, which may be related to various aspects of the present disclosure, which are described and/or claimed below. This discussion is believed to be helpful in providing the reader with background information to facilitate a better understanding of the various aspects of the present disclosure. Accordingly, it can be understood that these statements are to be read in this light, and not as admissions of prior art.

Motors in vehicles such as stepper motors can have multiple electromagnets arranged around a central gear-shaped piece of iron or other magnetically sensitive material. The electromagnets may be created by wrapped wire through which electrical current may selectively flow or not flow. The windings may be given electrical current by an external driver circuit such as a micro controller to move the internal gear through the selective electric flow through the motor windings. To make the motor shaft turn, first, one motor winding is given power, which generates a magnetic field to magnetically attract the stator teeth of a motor. When the stator teeth of the motor are aligned to the first electrically charged motor windings, the stator teeth are slightly offset from the next set of motor windings. The next set of motor windings may be electrically activated when the first motor winding is deactivated. The number of windings relates to the number of stator teeth of the motor shaft as well as the number of degrees a motor is able to turn.

SUMMARY

Generally, the present techniques relate to a device for estimating motor winding temperature including motor shaft and a motor winding including a first coil end and a second coil end where electrical current from the first coil end and the second coil end pass through a common wiring in response to activation of at least one of the first coil end or the second coil end to move the motor shaft. The techniques can be implemented through the use of a current sense resistor to detect the current passing through the common wiring. The techniques can be implemented through a digital to analog converter to convert an input voltage to analog for comparison to an output voltage to calculate a differential voltage using the signals received from the current sense resistor. The techniques can be implemented through the use of a processor to use the differential voltage to approximate a resistance experienced through the motor winding, the processor to generate an estimated motor winding temperature from a comparison of the approximated resistance of the motor winding to a temperature conversion curve.

The present techniques can also be implemented through a method for estimating motor winding temperature including activating at least one of a first coil end or a second coil end of a motor winding, where electrical current from the first coil end and the second coil end pass through a common wiring. The implementation of this technique further includes detecting current passing through the common wiring and calculating a differential voltage using signals received from the current sense resistor and an initial voltage supplied to the motor winding. The techniques disclosed herein further includes calculating a resistance of the motor winding with a processor using the differential voltage and a current input value. The implementations of this technique further include generating an estimated motor winding temperature from a comparison of the resistance of the motor winding to a temperature conversion curve.

In another example, a tangible, non-transitory, computer-readable medium can include instructions that, when executed by a processor, direct the processor to estimate motor winding temperature. The instructions may include directions that instruct a processor to activate at least one of a first coil end or a second coil end of a motor winding, where electrical current from the first coil end and the second coil end pass through a common wiring. The instructions may include directions that instruct a processor to detect current passing through the common wiring and calculate a differential voltage using signals received from the current sense resistor and an initial voltage supplied to the motor winding. The instructions may include directions that instruct a processor to calculate a resistance of the motor winding with a processor using the differential voltage. The instructions may include directions that instruct a processor to generate an estimated motor winding temperature from a comparison of the resistance of the motor winding to a temperature conversion curve.

BRIEF DESCRIPTION OF THE DRAWINGS

The above-mentioned and other features and advantages of the present disclosure, and the manner of attaining them, may become apparent and be better understood by reference to the following description of one example of the disclosure in conjunction with the accompanying drawings, where.

Correlating reference characters indicate correlating parts throughout the several views. The exemplifications set out herein illustrate examples of the disclosure, in one form, and such exemplifications are not to be construed as limiting in any manner the scope of the disclosure.

DETAILED DESCRIPTION OF EXAMPLES

One or more specific examples of the present disclosure are described below. In an effort to provide a concise description of these examples, not all features of an actual implementation are described in the specification. It can be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it can be appreciated that such a development effort might be complex and time consuming, and is a routine undertaking of design, fabrication, and manufacture for those of ordinary skill having the benefit of this disclosure.

The present disclosure describes a motor-winding temperature estimator. As used herein, the term temperature estimator refers to a device or component that identifies a temperature range or temperature estimate of a motor winding. A motor winding can refer to the windings of electrically conductive wire wrapped in a relatively circular fashion that when charged can move a motor. In an example, a temperature estimator may measure direct physical temperature attributes. In another example, the temperature estimator may calculate a temperature or range of temperatures based on resistance, voltage, time of use, and other similar properties discussed further herein.

In an example, the motor can be a stepper motor. Using temperature estimation can contribute to diagnostics for the motor and the circuitry operating the motor in order to protect against wear or overheating.

A motor can be used for modifying the angle or position of components in a vehicle. In an example, a mirror tilt direction in a vehicle can be moved by a stepper motor. Vehicle mirrors moved by a motor such as a stepper motor can be located in a vehicle Heads-Up Display (HUD). The HUD may include both the component to be moved, such as a mirror and a stepper motor with a stepper motor winding.

In an example, the stepper motor can be a four phase unipolar stepper motor with a common wiring connection. In an example, the motor may be driven by a Direct Current (DC) power supply. As the motor is driven and moved, current from the motor windings may pass through a current sense resistor with a known resistance. Based on the detections of the current sense resistor, the temperature of the stepper motor windings can be estimated when the signals from the current sense resistor are combined with other contextual factors about the stepper motor winding.

In an example, a four phase unipolar stepper motor can refer to a stepper motor with four windings each aligned with their own phase of motor movement. Other numbers of phases and windings are possible. In some examples, the motor windings may be grouped together in phases. In some examples, each motor winding may have an independent phase from the other windings of a motor. In some examples such as a motor with four motor windings all connected to a common wiring, current from the common wiring may pass through a current sense resistor, and the four motor windings can be switched or alternated during operation to ground through an open collector NPN transistor array.

As discussed herein, the temperature of a stepper motor winding can be approximated based on a differential voltage determined with a current sense resistor. From the detection of the current sense resistor detection and the known resistance of the current sense resistor, as well as Ohms law, Voltage=Resistance*Current, an output voltage can be calculated from electrical signals that have passed through the motor windings. Using the calculated voltage, this value can be compared to an input voltage and used to find a differential voltage. The differential voltage can be converted to an approximated resistance measurement and then an estimated temperature that corresponds to the approximated resistance. The correlation of the approximated resistance to an estimated temperature can be made using either a statistical, experimental, or calculated curve relating the approximated resistance for the motor windings to a temperature of the motor windings.

In an example, the curve relating the approximated resistance to approximated temperature of the motor windings can be based on statistical interpretations of past measurements of resistance and temperature for the motor windings. In an example, the curve relating the approximated resistance to the approximated temperature of the motor windings can be based on calculations using other factors as inputs including the material of the motor winding wire, the previous temperature of the motor winding, a time duration since last use of the motor winding, the time duration of use of the motor winding, and other facts.

In an example, one way to generate a differential voltage for use in approximating resistance of a motor winding is to run a known current from the motor winding across a current sense resistor with a known resistance in order to calculate a voltage after the current has passed through the winding. This measured voltage can be converted from analog to digital and compared to a digital signal indicating the initial voltage supplied in order to determine a differential voltage resulting from the current passing through the motor winding.

Once a specific resistance has been calculated, the temperature can be estimated for a specific winding using a resistance-to-temperature curve. As used herein, a resistance-to-temperature curve relates to the relationship between resistance and temperature for a specific winding. For example, for a winding of a specific wire thickness and material, a measured resistance electrical current encounters can correspond to a specific temperature approximation equation. As the wire thickness and wire material are related to how electrical resistance affects the temperature of the windings, these variables, if known allow the approximation of temperature without the use of a thermometer sensor through the use of a generated resistance-to-temperature curve. Other factors about a device or system may also be included in temperature estimation including time of operation of the stepper motor, time since the last operation, how long a stepper motor has been unused, and other similar factors. In an example, if a time since last operation is used to approximate the temperature of the motor windings, this can involve an estimation of how quickly a motor winding cools off when not in use. Likewise, the time of operation, the duration of operation, and the last temperature detected or estimated can also be relevant in a temperature estimation made on the motor windings.

The ability to identify the temperature of motor windings using electrical resistance means that temperature estimations are made in real time, can be adjusted as electrical current and voltage measurements change, and allow these estimations to be made without a thermometer directly measuring a temperature. Further, estimating or approximating the temperature in real time using current and voltage measurements enables the device to detect when a temperature of the windings passes an unsafe operation threshold and shut off or slow the motor in that circumstance. Thus the present techniques prevent an over temperature condition in a motor that could cause stress and damage to the motor. The ability to estimate temperature for a motor winding without a separate thermometer reduces cost of manufacturing, complexity, and saves space within a circuitry housing for a stepper motor.

Figure 1:
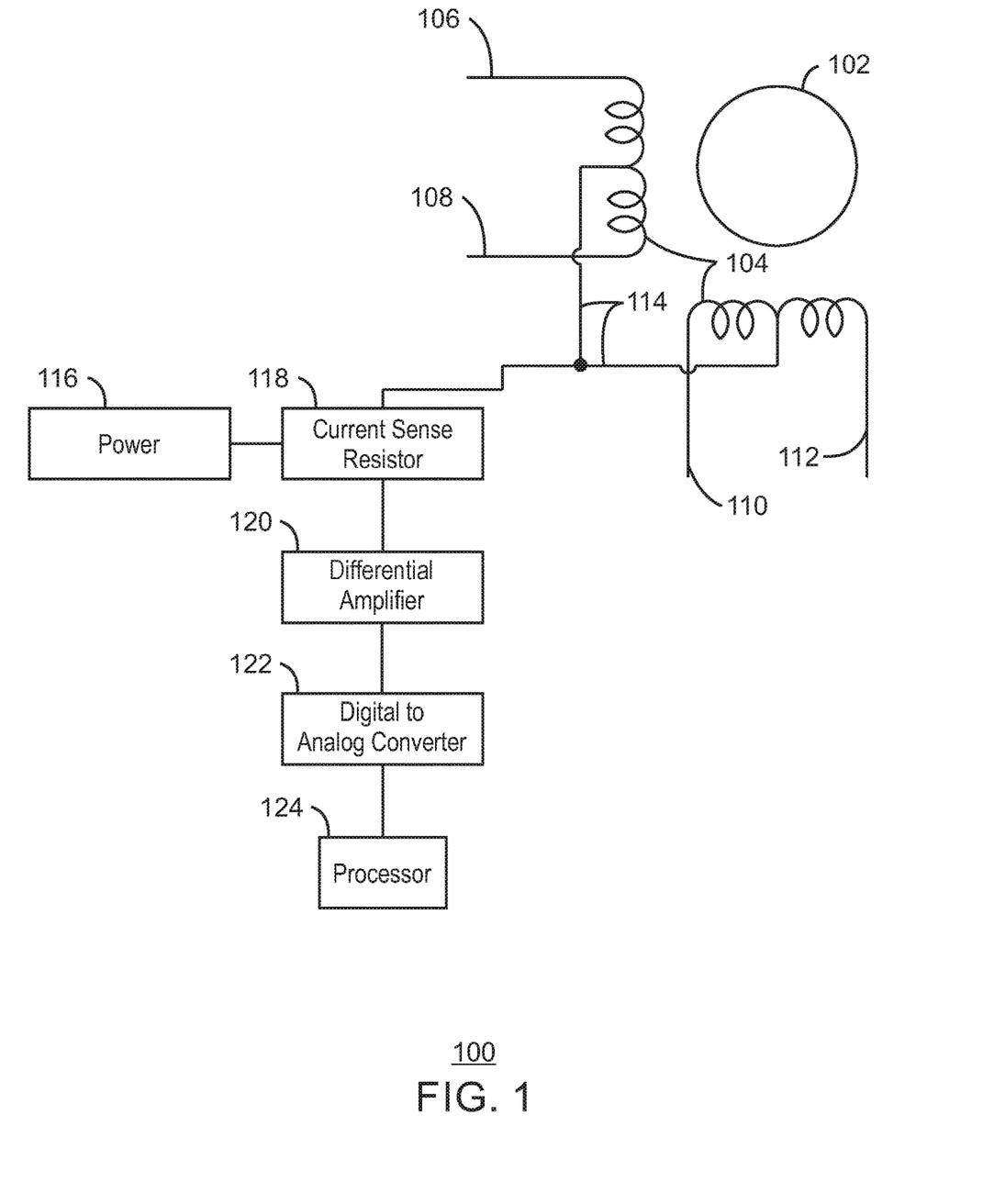
FIG. 1 is a drawing of an example motor winding temperature estimator.

FIG. 1 is a drawing of an example motor winding temperature estimator 100. As this is a drawing, the figure includes components that both may or may not conduct electricity. While the lines in FIG. 1 can show electrical pathways, they are intended instead to indicate a general flow of information, electricity, or association between certain components as described herein.

The motor shaft 102 is shown between a motor winding 104. The motor shaft 102 can include stator teeth, other shapes, or other configurations of magnetically sensitive components to enable manipulation by the motor winding 104 being selectively charged or not charged with electrical current. The motor winding 104 can be divided into areas surrounding the motor shaft 102. In an example not shown in FIG. 1, the motor winding 104 can surround the motor shaft in a 360 degree surrounding of the motor along the plane of the motor shaft 102. In an example, the motor winding 104 may surround half or less of the angles, i.e. 180 degrees or fewer, of the motor shaft 102. The motor shaft 102 may be constructed of iron, other magnetic metals, or any other suitable material that can respond to electromagnetic fields being formed by electrical charge passing through motor winding 104. The motor winding 104 may be a metal electrically conductive winding. In an example, the motor winding 104 can be any material surrounding a motor shaft that can generate a magnetic field. The motor winding 104 may generate heat due to the resistance experienced by the electrical current in the motor winding 104. In an example, the motor, which includes both the motor shaft 102 and the motor winding 104, can be a unipolar stepper motor, a bipolar stepper motor, or any other motor driven by components that generate heat due to electrical current passing through the component during motor operation. The motor winding 104 can be coupled to power through a current sense resistor as discussed herein.

The motor winding 104 can include a first coil end 106, a second coil end 108, a third coil end 110, and a fourth coil end 112. Each coil end may be selectively powered or activated when instructed in order to generate a magnetic field in order to turn the motor shaft 102 in a desired direction or to a desired location. In an example, each coil end can be paired with one or more other coil ends in order to coordinate a particular pattern of electrical activation in order to continue movement of a motor shaft 102. When one coil end has current flowing through it, the movement of the electrical current can create a magnetic field that attracts the stator teeth of the motor shaft 102. The pulling of the stator teeth towards the location of the coil end that is energized causes rotation of the motor shaft 102. This movement by the motor shaft is controlled by the specific coil end used as well as the number of coil ends used around the motor shaft 102.

In an example where the motor is a unipolar stepper motor, the motor winding 104 includes one center tap per section of the motor winding 104, where the center tap is shown in FIG. 1 by the combined common wiring 114 connected to each section of the motor winding 104. Each section of the motor winding 104 is switched on through use of the coil ends. The sequential deployment of current through each coil end of the motor winding 104 likewise moves the magnetic field formed through each of the coil ends. The movement of the magnetic field generated by the electrical current passing through a sequence of coil ends of the motor winding 104 attracts the stator teeth of the motor shaft 102 such that the motor shaft 102 turns is follow the direction of magnetic field movement. The center tap of each winding is made common with other coil ends as the electrical current may flow through this common connection regardless of which coil end is activated. The use of the common wiring can reduce the number of leads needed to form a complete circuit for each of the motor windings coil ends. In an example, a current sense resistor can be connected through a field-electric transistor to a ground, where the current sense detector detects over-current conditions. In this example, replacing a comparator with an analog to digital converter, could measure temperature for haptic solenoids where multiple parallel solenoids have a common power supply and share a common current sink resistor. In this example, the motor shaft may be an actuator that is not for full rotation but instead for actuation.

In an example, and as seen in FIG. 1, the two sides of the motor winding 104 include center taps for common wiring 114 that is internally joined, so the motor has only five leads. As the motor winding 104 has coil ends that are switched on, the common wiring 114 experiences an electrical current that has been affected by the resistance in the motor winding 104. The winding 104 is coupled to power 116 through a current sense resistor 118. As used herein, the term common can be used in the context where the motor power supply is common between the multiple phase windings 106, 108, 110, and 112. The electrical current for the phase windings can be switched through to ground through a bipolar Darlington transistor.

In an example, the current sense resistor 118 can aid in calculating a differential voltage value by measuring current passing from the common wiring 114 together with the known resistance of the current sense resistor 118. Using the relationship of Ohms Law, where Voltage=Resistance*Current, the current sense resistor 118 can convert a measured current passing through the known resistor into a voltage and can compare it to a known input voltage in order to calculate a differential voltage. The Digital to Analog converter (DAC) 122 can be used to convert a digital input voltage to analog for comparison to the calculated voltage from the measured current at the current sense resistor 118 after the electrical charge has passed through the windings. In an example, an analog to digital converter is used with the current sense resistor to convert analog signal to digital for use in later calculations. Using Ohms law, the known current, and the known resistance can be used to calculate a voltage to be compared to an input voltage. This comparison can yield a differential voltage for use in estimating the temperature of the motor windings. In an example the known input voltage can be digital and converted to an analog signal for comparison using a DAC. This analog voltage can be used in comparison to the voltage calculated from the measurements of the current sense resistor 118. In another example where an analog to digital converter is used, the analog signal measured from the current sense resistor can be used to compare to a digital value in generating a differential voltage. As discussed herein, the differential voltage can be used to estimate resistance experienced by the electrical current in the motor winding 104 and this estimated resistance be correlated to a temperature using a resistance-to-temperature curve.

In order to approximate a temperature of the motor winding 104, the processor 124 may also take into account a time since the last operation of the motor, a time of operation of the motor, and an estimated heat dissipation rate for the motor winding 104. The relationship between the resistance of the motor winding 104 and the temperature of the motor wiring 104 may be a stored as a mathematical regression mapping the relationship of these two variables either on a chart or as data points used in estimating a trend line showing the relationship in these two variables, in an example, the mathematical relationship between the resistance of the motor winding 104 and the temperature of the motor winding 104 can be approximated through a calibration with a temperature sensor prior to deployment of the motor or through a stored array of data for similar winding sizes, materials, and winding patterns. Based on the temperature calculated by the processor 124, the processor 124 may also react to an over temperature condition by slowing or stopping function of the motor. In an example, if the estimated temperature of the motor winding 104 exceeds a set threshold or exceeds a set threshold for a particular amount of time, then the processor 124 can instruct the slowing or stopping of the motor by prohibiting current flow to the motor winding 104.

Figure 2:
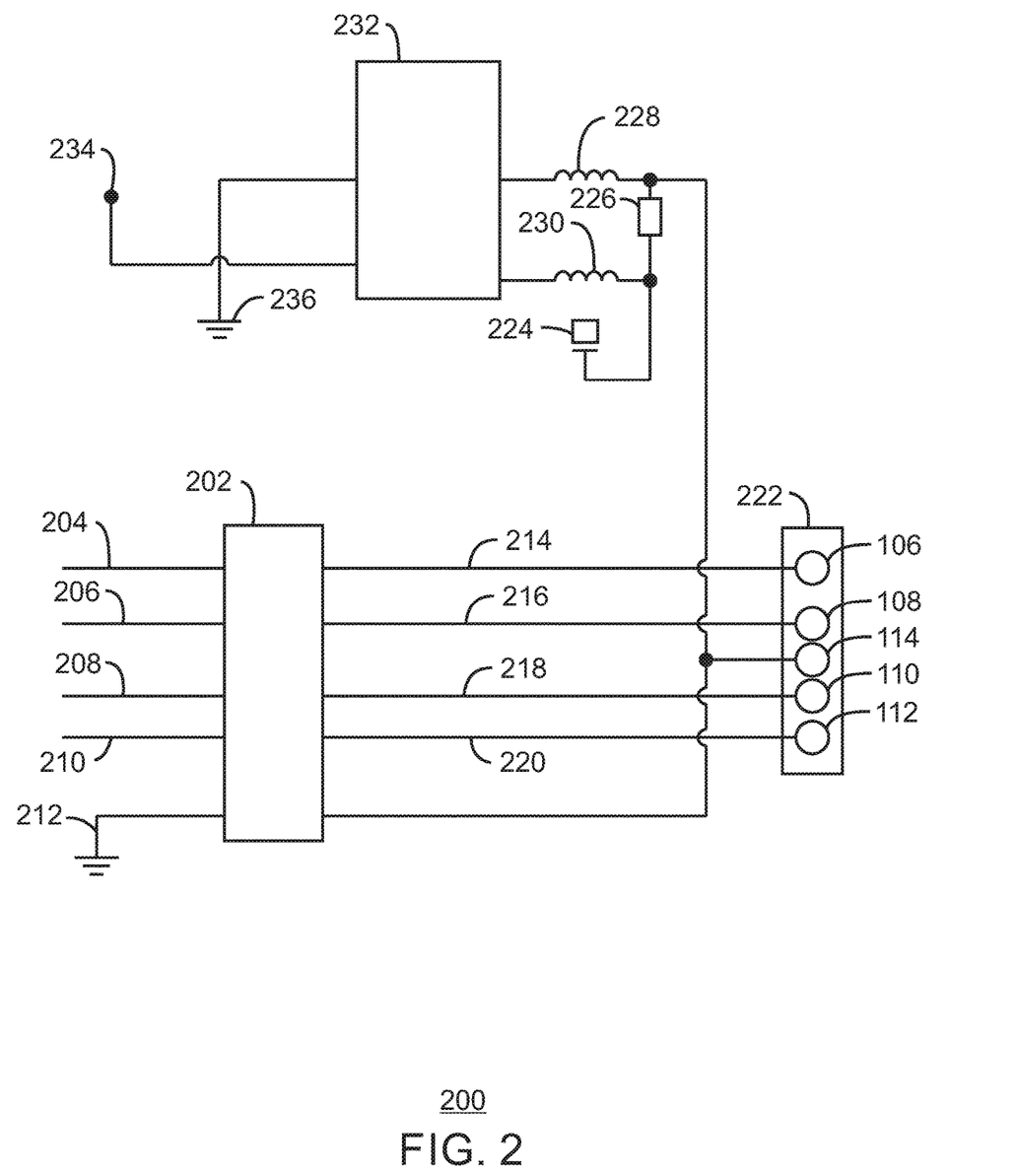
FIG. 2 is a drawing of an example circuitry for a motor winding temperature estimator.

FIG. 2 is a drawing of an example circuitry 200 for a motor winding temperature estimator. Like numbered items are as described with respect to FIG. 1.

The example circuitry 200 for a motor winding temperature estimator can include a transistor array 202. As used herein, a transistor array can be composed of multiple transistors in one package and can increase mounting density as well as reduce the board population costs associated with the use of discrete transistors. In an example, the transistor array 202 can be a Darlington transistor array which is a transistor array with a compound structure designed with at least two bipolar transistors connected so that the current amplified by a first transistor is amplified further by a second transistor. The amplification allows a higher current gain than each transistor in the transistor array 202 taken separately. The transistor pairs within the transistor array 202 can connect the first control wire 204, the second control wire 206, the third control wire 208, and the fourth control wire 210 either through the transistor array 202 to a ground wire 212, or with first coil end control wire 214, the second coil end control wire 216, the third coil end control wire 218, and the fourth coil end control wire 220, respectively. As used herein, the term wire can include a large variety of electronically conductive medium including metal wire, leads, circuit board traces, graphite, electrically conductive polymers, and other similar electrical conductors. These control wires may control the function of the motor as the signals that pass through the control wires pass current through their corresponding coil end. As discussed herein, the selective powering of each coil end is the driving force behind the movement of the motor shaft 102 to align with the coil end that is transmitting electric current.

The control exercised by the control wires is enacted through the electrical signals transmitted on the control wires 204-210 which correspond respectively to the electrical signals that on coil end control wires 214-220. The electrical signals on the coil end control wires 214-220 connect to their respective coil ends through a coil end connector 222. As used herein, the coil end connector 222 may be an electro-mechanical device used to join electrical terminations and create an electrical circuit, in this case between control wires and the first through fourth coil ends 106-112. As used herein, the coil end connector can include plugs and jacks, and enable temporary connections or connections intended to last as long as the use of the circuitry 200. As shown in FIG. 1, the coil ends 106-112 may be powered in sequence due to the signals received from the control wires 204-210 and 214-220 causing a specific sequence of electrically powered coil ends and a corresponding movement from the creation of electromagnetic fields affecting a motor 224. In an example the motor has stator teeth. In an example, the motor is a stepper motor. In an example, the motor may be a unipolar stepper motor or a bipolar stepper motor. In an example, the motor may move as a result of the electromagnetic field generated as electrical current passes through a motor winding 104. The combined common wiring 114 may be switched to the ground wire 212 through the transistor array 202 in order to provide a ground to the coil-end windings. In an example, the transistor array 202 is a bipolar Darlington transistor array. As shown in FIG. 1, the coil end windings may each connect to the motor winding 104 is connected to power 116 through a current sense resistor.

The common wiring 114 may connect the coil end windings with a current sense resistor 226 such as a current sense resistor. In an example, the current sense resistor 226 may convert a measured current passing through the current sense resistor into a voltage using a known resistance and Ohms law. The electrical charge from the common wiring 114 may also pass through the current sense resistor 226 and through either a first lo-pass filter 228 or a second lo-pass filter 230. As used herein, both the first and second lo-pass filters 228 and 230 enable the filtering out of Electromagnetic Interference (EMI) generated by the motor 224 and other circuitry that could interfere with the estimation of the winding temperature by distorting the signal from the common wiring 114 to the differential amplifier integrated circuit 232. The signal 234 transmitted from the differential amplifier 232 referenced to ground 236 proportional to the current through the current sense resistor 226.

The signal 234 provided by the differential amplifier IC 232 can be converted from analog to digital for calculations and comparisons between input voltage signals to determine a differential voltage. In an example, the input voltage may be known and compared to the output signal 234 provided by the differential amplifier IC 232. The signal 234 can be used in a calculation of a temperature as a determined differential voltage corresponds to a resistance electrical signal experiences through the motor windings 104 and thus correlates to a temperature of the windings. An estimated voltage for the coil end windings can be approximated using the differential voltage found with by the current sense resistor.

The differential voltage determined by the current sense resistor, together with the current passed through the coil ends can correspond to a temperature of the motor winding. In an example, when the windings are for the stepper motor, the windings temperature can be monitored in real time as the calculations for resistance, voltage, and current can be continuously updated through use of current sense resistor, known input current and a measured differential voltage. In an example, the differential amplifier integrated circuit 232 transmits a signal 234 referenced to ground 236 proportional to the current through the current sense resistor 226.

Once an approximate temperature is calculated for the motor winding, this approximation can be used to ensure that the motor operates within a safe range of temperatures for the motor windings. For example, the operation duration, speed, frequency of operation of a motor can be capped in real time based on the real time calculation of temperature of the coil end wiring. As discussed above, a specific temperature may not be calculated, but instead a relative temperature or a range of temperatures may be approximated based on the current and differential voltages measured in the system, in an example, an approximated temperature range can be within 10 degrees centigrade of an actual temperature on the motor winding. Accordingly, a resistance indicating a temperature that exceeds a safe operating temperature by at least 10 degrees may result in deactivation or slowing of operation of the motor through the slowing of signals sent through the control wires to the coil end windings. In an example, the temperature is estimated as within 10 degrees of a damaging level the operation of the windings may change.

As discussed herein, a temperature estimate for the windings may be generated based on comparing the approximated resistance of the motor windings to a resistance-to-temperature curve. In an example, the resistance-to-temperature curve may correspond a resistance of a specific motor to a temperature. The shape and values for this curve can be experimentally determined based on pre-deployment measurements being taken with a thermometer of the winding temperature at different motor winding resistances as approximated by a measured and estimated differential voltage. In an example, the resistance-to-temperature curve may be mathematically generated without any direct measurement of temperature with a thermometer and instead relying on inherent properties of the coil end winding. In an example, the inherent properties of the coil end winding can include knowing the material of the winding, the thickness of the winding, and other physical traits that can affect the temperature as a known current and voltage pass through them. Knowing the material of the winding, such as the percentages of several kinds of metal in a particular wire alloy or other composite metal can relate to the temperature of the material as a known or calculated electrical current passes through that material. Similarly, the known thickness of a winding may correspond to an increase or decrease in temperature rise for each change in calculated current and voltage that passes through the wire making the coil end wirings.

In response to an over-temperature condition, the circuitry 200 may activate a switch to prevent current from reaching the coil end windings. In an example, the switch may be between the transistor array 202 and the coil end connector 222. In an example, the switch may redirect current to a ground wire 212. In an example, the switch may alter the signal from the coil end control wires at the transistor array 202. In an example, the switch to prevent an overheating coil end winding may be instructions stored in a memory for execution over a processor that modifies the speed, intensity, or other delivery of coil end control wire signals. Other factors used in determining a coil end winding temperature estimate can include a cool down time rate also either statistically sampled, experimentally determined, or mathematically calculated. When a cool down rate for coil end windings is known, as well as a time and intensity of last operation of the motor, a more accurate estimate of temperature can be maintained. In an example, the calculations of temperature estimates may account for potential cool down times afforded by time between a first stepper motor instruction and a second stepper motor instruction.

While the circuitry 200 in FIG. 2 shows a uni-directional stepper motor, in theory, the coil end wiring, and estimation of wiring temperature could also be applied to a bi-directional motor as long as sensors are included for measuring the input voltage from the control wires and error is accounted for through the transistor array 202 and the bi-directional motor. Further, as used herein, the estimate of temperature is also a relative estimate of temperature due to the errors in the calculations made for wiring, the temperature curve, as well as the voltage on the wiring is being approximated. In another embodiment, one embodiment of coil end winding temperature estimator, a voltage sensor could be directly measured instead of relatively measured, where the direct measurements were from the actual wiring of the circuitry 200. In cases where the actual input voltage and output voltages are known along the wire of a stepper motor and coil end windings, then an absolute temperature could be calculated rather than a relative temperature.

The alteration of the control wire signals may result in slower or halted signaling between each of the coil end windings. The prevention of operation during an over-temperature condition can extend the life of the windings as hot and overheating windings can degrade more quickly and eventually cease function thus preventing operation of a motor. In an example, the motor using the coil end windings may be a stepper motor. A stepper motor may be used in equipment such as linear actuators, linear stages, rotation stages, goniometers, and mirror mounts such as mirror mounts in vehicles. Stepper motors may also be used in in floppy disk drives, flatbed scanners, computer printers, plotters, slot machines, image scanners, compact disc drives, intelligent lighting, camera lenses, and 3D printers. Accordingly, the prevention of damage to coil end windings through temperature monitoring and control enables the increase in lifespan for the overall motor for these and other products.

Figure 3:
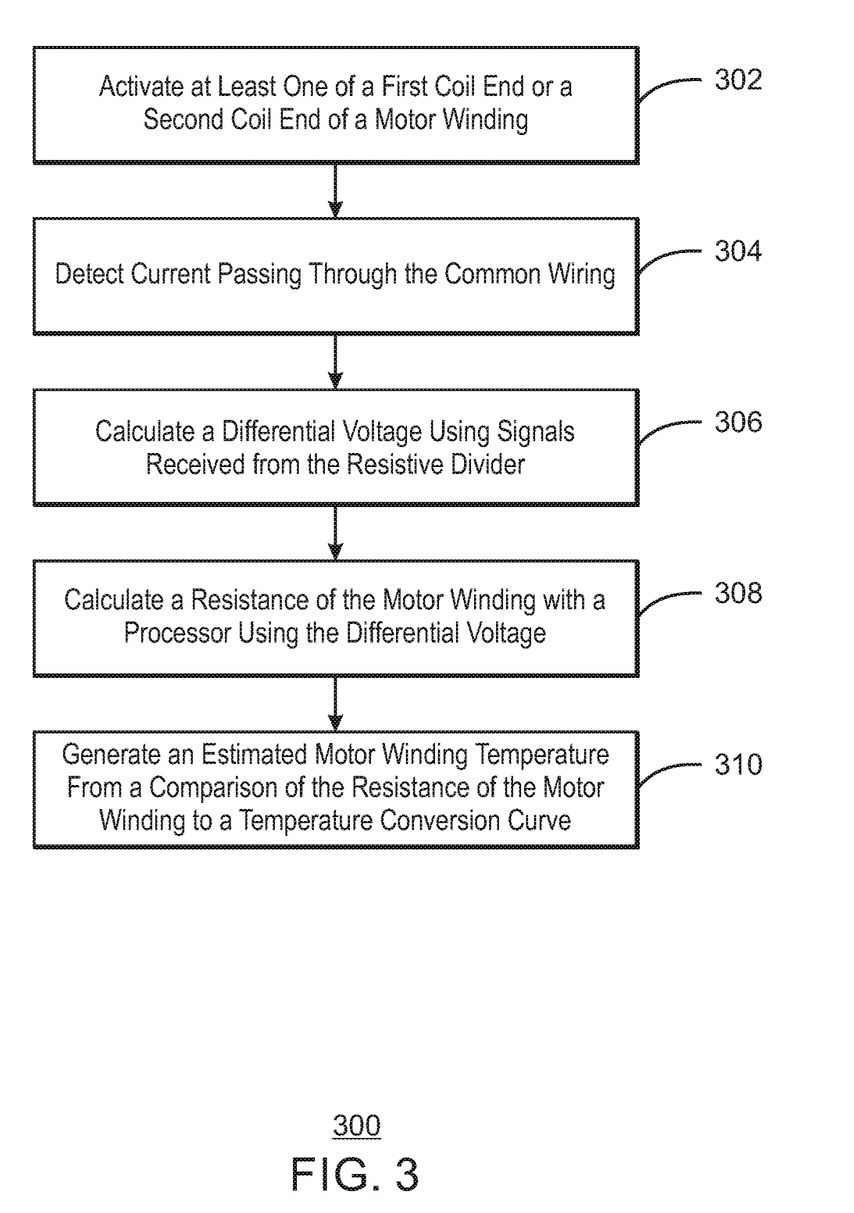
FIG. 3 is a process flow diagram of an example method for motor winding temperature estimation.

FIG. 3 is a process flow diagram of an example method 300 for motor winding temperature estimation. At block 302, as part of estimating motor winding temperature, activate at least one of a first coil end or a second coil end of a motor winding, where electrical current from the first coil end and the second coil end pass through a common wiring. In an example, the motor winding is for a stepper motor or a unipolar stepper motor. At block 304, as part of estimating motor winding temperature, detect current passing through the common wiring.

At block 306, as part of estimating motor winding temperature, calculate a differential voltage using an initial voltage supplied to the motor winding and signals received from the current sense resistor measuring current across the current sense resistor with a known resistance to calculate a voltage. In an example, the current sense resistor is a current sense resistor. At block 308, as part of the method to estimate motor winding temperature, calculate a resistance of the motor winding with a processor using the differential voltage and a current input value.

At block 310, as part of estimating motor winding temperature, generate an estimated motor winding temperature from a comparison of the resistance of the motor winding to a temperature conversion curve. In an example, the temperature conversion curve is generated through calibration of the motor winding through use of a thermometer. The temperature conversion curve may also be generated through mathematically generated models based on the thickness and material of the motor winding. In an example, generating an estimated motor winding temperature as seen in block 310 includes a time of winding operation, a time since last winding operation, a previously estimated motor winding temperature, and a time of most recent previously estimated motor winding temperature.

In an example, as part of estimating motor winding temperature, an over-temperature condition shutdown switch may stop current from reaching the motor winding in response to a detection that the estimated motor winding temperature puts the motor into an over-temperature condition. An over-temperature condition shutdown switch may stop current from reaching the motor winding in response to a detection that the estimated motor winding temperature puts the motor into an over-temperature condition for longer than a set time duration. In the method 300 shown in FIG. 3, in some cases, no thermometer is used for measuring temperature of the motor windings by contact or analysis of the surface of the motor winding.

Figure 4:
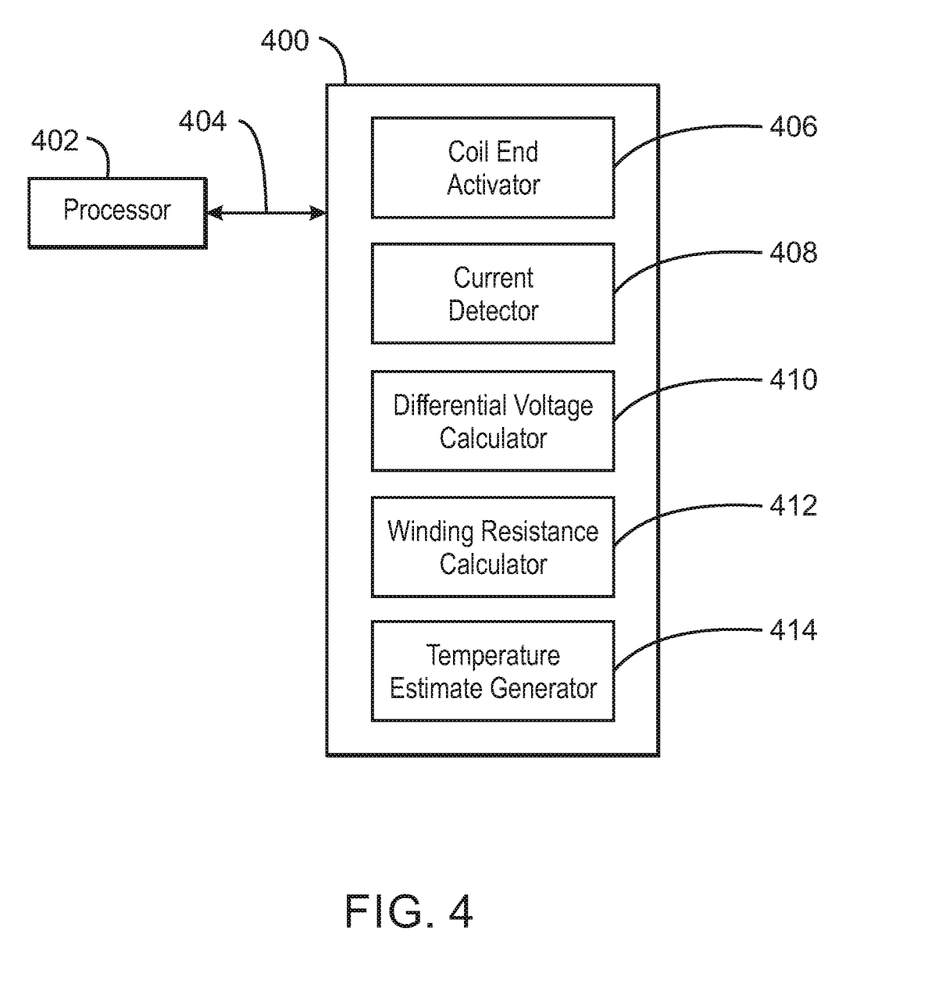
FIG. 4 is a drawing of an example computer-readable medium storing instructions, that when executed on a processor provides motor winding temperature estimation.

FIG. 4 is a drawing of an example computer-readable medium 400 storing instructions, that when executed on a processor provides motor winding temperature estimation. The tangible, non-transitory, computer-readable medium 400 includes instructions that, when executed by a processor 402 can direct the processor 402 through a bus 404 to estimate motor winding temperature.

The computer-readable medium 400 includes a coil end activator 406 to activate at least one of a first coil end or a second coil end of a motor winding, where electrical current from the first coil end and the second coil end pass through a common wiring. In an example, the motor winding is for a stepper motor or a unipolar stepper motor. The computer-readable medium 400 includes a current detector 408 to detect current passing through the common wiring.

The computer-readable medium 400 includes a differential voltage calculator 410 to calculate a differential voltage using an initial voltage supplied to the motor winding and signals received from the current sense resistor measuring current across the current sense resistor with a known resistance to calculate a voltage. In an example, the current sense resistor is a current sense resistor. The computer-readable medium 400 includes a winding resistance calculator 412 to calculate a resistance of the motor winding with a processor using the differential voltage and a current input value.

The computer-readable medium 400 includes a temperature estimate generator 414 to generate an estimated motor winding temperature from a comparison of the resistance of the motor winding to a temperature conversion curve. In an example, the temperature conversion curve is generated through calibration of the motor winding through use of a thermometer. The temperature conversion curve may be generated through mathematically generated models based on the thickness and material of the motor winding.

In an example, the computer-readable medium 400 includes instructions for stopping current from reaching the motor winding with an over-temperature condition shutdown switch in response to a detection that the estimated motor winding temperature puts the motor into an over-temperature condition. Further, this stopping of current from the motor winding may also occur, in response to a detection that the estimated motor winding temperature puts the motor into an over-temperature condition for longer than a set time duration. The computer-readable medium 400 may avoid use of a thermometer for measuring temperature of the motor windings by contact or analysis of the surface of the motor winding. In an example, the computer-readable medium 400 includes instructions for generating an estimated motor winding temperature including a time of winding operation, a time since last winding operation, a previously estimated motor winding temperature, and a time of most recent previously estimated motor winding temperature.

What is claimed is:

1. A device for estimating motor winding temperature:
   a motor shaft;
   a motor winding comprising a first coil end and a second coil end where electrical current from the first coil end and the second coil end pass through a common wiring in response to activation of at least one of the first coil end or the second coil end to move the motor shaft;
   a current sense resistor to measure a differential voltage through the common wiring;
   an analog to digital converter to convert the output signal of the current sense resistor for comparison to the voltage and to generate a differential voltage using the signals received from the current sense resistor and an initial voltage supplied to the motor winding;
   a processor to use the differential voltage and a current input value to calculate a resistance of the motor winding, the processor to generate an estimated motor winding temperature from a comparison of the resistance of the motor winding to a temperature conversion curve; and
   an over-temperature condition shutdown switch to stop current from reaching the motor winding in response to a detection that the estimated motor winding temperature puts the motor into an over-temperature condition for longer than a set time duration.

2. The device of claim 1, wherein the motor winding is for a stepper motor.

3. The device of claim 1, wherein the motor winding is a haptic solenoid, the current sense resistor is connected through a field transistor array, and the motor shaft is an actuator.

4. The device of claim 1, wherein the current sense resistor is a series current sense resistor.

5. The device of claim 1, wherein the temperature conversion curve is generated through calibration of the motor winding through use of a thermometer.

6. The device of claim 1, wherein the temperature conversion curve is generated through mathematically generated models based on the thickness and material of the motor winding.

7. The device of claim 1, wherein no thermometer is used for measuring temperature of the motor windings by contact or analysis of the surface of the motor winding.

8. The device of claim 1, wherein generating an estimated motor winding temperature includes a time of winding operation, a time since last winding operation, a previously estimated motor winding temperature, and a time of most recent previously estimated motor winding temperature.

9. A method for estimating motor winding temperature comprising:
   activating at least one of a first coil end or a second coil end of a motor winding, where electrical current from the first coil end and the second coil end pass through a common wiring;
   detecting current passing through the common wiring;
   calculating a differential voltage using an initial voltage supplied to the motor winding and signals received from the current sense resistor measuring a differential voltage; and
   calculating a resistance of the motor winding with a processor using the differential voltage signal output from the current sense resistor and a current input value; and
   generating an estimated motor winding temperature from a comparison of the resistance of the motor winding to a temperature conversion curve, wherein the temperature conversion curve is generated through mathematically generated models based on the thickness and material of the motor winding.

10. The method of claim 9, comprising an over-temperature condition shutdown switch to stop current from reaching the motor winding in response to a detection that the estimated motor winding temperature puts the motor into an over-temperature condition.

11. The method of claim 9, comprising an over-temperature condition shutdown switch to stop current from reaching the motor winding in response to a detection that the estimated motor winding temperature puts the motor into an over-temperature condition for longer than a set time duration.

12. The method of claim 9, wherein the motor winding is for a stepper motor.

13. The method of claim 9, wherein the motor winding is a haptic solenoid, and the current sense resistor is connected through a field transistor array.

14. The method of claim 9, wherein the current sense resistor is a series current sense resistor.

15. The method of claim 9, wherein the temperature conversion curve is generated through calibration of the motor winding through use of a thermometer.

16. The method of claim 9, wherein no thermometer is used for measuring temperature of the motor windings by contact or analysis of the surface of the motor winding.

17. The method of claim 9, wherein generating an estimated motor winding temperature includes a time of winding operation, a time since last winding operation, a previously estimated motor winding temperature, and a time of most recent previously estimated motor winding temperature.

18. A tangible, non-transitory, computer-readable medium comprising instructions that, when executed by a processor, estimates motor winding temperature, the instructions to direct the processor to:

activate at least one of a first coil end or a second coil end of a motor winding, where electrical current from the first coil end and the second coil end pass through a common wiring;

detect current passing through the common wiring via a current sense resistor;

calculate a differential voltage using an initial voltage supplied to the motor winding and signals received from the current sense resistor measuring a differential voltage; and calculate a resistance of the motor winding using the measured differential voltage;

generate an estimated motor winding temperature from a comparison of the resistance of the motor winding to a temperature conversion curve; and activate an over-temperature condition shutdown switch to stop current from reaching the motor winding in response to a detection that the estimated motor winding temperature puts the motor into an over-temperature condition for longer than a set time duration.

19. The computer-readable medium of claim 18, wherein the motor winding is for a stepper motor.

20. The computer-readable medium of claim 18, wherein the motor winding is a haptic solenoid, and the current sense resistor is connected through a field transistor array.

21. The computer-readable medium of claim 18, wherein the current sense resistor is a series current sense resistor.

22. The computer-readable medium of claim 18, wherein the temperature conversion curve is generated through calibration of the motor winding through use of a thermometer.

23. The computer-readable medium of claim 18, wherein the temperature conversion curve is generated through mathematically generated models based on the thickness and material of the motor winding.

24. The computer-readable medium of claim 18, wherein no thermometer is used for measuring temperature of the motor windings by contact or analysis of the surface of the motor winding.

25. The computer-readable medium of claim 18, wherein generating an estimated motor winding temperature includes a time of winding operation, a time since last winding operation, a previously estimated motor winding temperature, and a time of most recent previously estimated motor winding temperature.

* * * * *